(12) United States Patent
Kobayashi et al.

(10) Patent No.: US 8,397,668 B2
(45) Date of Patent: Mar. 19, 2013

(54) PLASMA PROCESSING APPARATUS

(75) Inventors: Hiroyuki Kobayashi, Kodaira (JP); Kenji Maeda, Kokubunji (JP); Kenetsu Yokogawa, Tsurugashima (JP); Masaru Izawa, Hino (JP); Tadamitsu Kanekiyo, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 169 days.

(21) Appl. No.: 12/398,226

(22) Filed: Mar. 5, 2009

(65) Prior Publication Data

US 2009/0194235 A1 Aug. 6, 2009

Related U.S. Application Data

(63) Continuation of application No. 10/911,610, filed on Aug. 5, 2004, now abandoned.

(30) Foreign Application Priority Data

Jul. 26, 2004 (JP) ................................. 2004-217118

(51) Int. Cl.
| | |
|---|---|
| *C23C 16/455* | (2006.01) |
| *C23C 16/50* | (2006.01) |
| *C23C 16/503* | (2006.01) |
| *C23C 16/505* | (2006.01) |
| *C23C 16/509* | (2006.01) |
| *C23F 1/00* | (2006.01) |
| *H01L 21/306* | (2006.01) |
| *C23C 16/06* | (2006.01) |
| *C23C 16/22* | (2006.01) |

(52) U.S. Cl. ............... 118/723 E; 118/715; 156/345.24; 156/345.29; 156/345.33; 156/345.34; 156/345.43; 156/345.44; 156/345.45

(58) Field of Classification Search ............... 118/723 E, 118/715; 156/345.24, 345.29, 345.33, 345.34, 156/345.43, 345.44, 345.45

See application file for complete search history.

(56) References Cited

U.S. PATENT DOCUMENTS

| | | | | | |
|---|---|---|---|---|---|
| 4,557,950 | A | * | 12/1985 | Foster et al. | 438/774 |
| 4,798,166 | A | * | 1/1989 | Hirooka et al. | 118/719 |
| 4,826,585 | A | * | 5/1989 | Davis | 204/298.37 |
| 4,836,136 | A | * | 6/1989 | Natsuhara | 399/276 |

(Continued)

FOREIGN PATENT DOCUMENTS

| | | | |
|---|---|---|---|
| JP | 02185967 A | * | 7/1990 |
| JP | 10-158844 | | 6/1998 |

(Continued)

OTHER PUBLICATIONS

Machine Translation of IDS reference to Mitani Katsuhiko (JP 11-016888 A).*

*Primary Examiner* — Rudy Zervigon

(74) *Attorney, Agent, or Firm* — Antonelli, Terry, Stout & Kraus, LLP.

(57) ABSTRACT

The object of the invention is to provide a plasma processing apparatus having enhanced plasma processing uniformity. The plasma processing apparatus comprises a processing chamber 1, means 13 and 14 for supplying processing gas into the processing chamber, evacuation means 25 and 26 for decompressing the processing chamber 1, an electrode 4 on which an object 2 to be processed such as a wafer is placed, and an electromagnetic radiation power supply 5A, wherein at least two kinds of processing gases having different composition ratios of $O_2$ or $N_2$ are introduced into the processing chamber through different gas inlets so as to control the in-plane uniformity of the critical dimension while maintaining the in-plane uniformity of the process depth.

6 Claims, 11 Drawing Sheets

U.S. PATENT DOCUMENTS

| | | | |
|---|---|---|---|
| 4,916,089 A * | 4/1990 | Van Suchtelen et al. | 117/93 |
| 4,980,204 A * | 12/1990 | Fujii et al. | 117/98 |
| 5,057,185 A * | 10/1991 | Thomas et al. | 438/710 |
| 5,110,438 A * | 5/1992 | Ohmi et al. | 204/298.34 |
| 5,145,711 A * | 9/1992 | Yamazaki et al. | 427/571 |
| 5,179,498 A * | 1/1993 | Hongoh et al. | 361/234 |
| 5,200,388 A * | 4/1993 | Abe et al. | 505/447 |
| 5,252,178 A * | 10/1993 | Moslehi | 134/1.1 |
| 5,269,881 A * | 12/1993 | Sekiya et al. | 134/1.1 |
| 5,272,417 A * | 12/1993 | Ohmi | 315/111.21 |
| 5,338,363 A * | 8/1994 | Kawata et al. | 118/725 |
| 5,431,738 A * | 7/1995 | Murakami et al. | 118/720 |
| 5,445,709 A * | 8/1995 | Kojima et al. | 438/729 |
| 5,453,124 A * | 9/1995 | Moslehi et al. | 118/715 |
| 5,464,499 A * | 11/1995 | Moslehi et al. | 438/729 |
| 5,496,408 A * | 3/1996 | Motoda et al. | 118/715 |
| 5,500,256 A * | 3/1996 | Watabe | 427/579 |
| 5,512,130 A * | 4/1996 | Barna et al. | 438/714 |
| 5,529,657 A * | 6/1996 | Ishii | 156/345.26 |
| 5,532,190 A * | 7/1996 | Goodyear et al. | 438/710 |
| 5,563,092 A * | 10/1996 | Ohmi | 438/485 |
| 5,593,741 A * | 1/1997 | Ikeda | 427/579 |
| 5,669,976 A * | 9/1997 | Yuuki et al. | 118/725 |
| 5,683,517 A * | 11/1997 | Shan | 118/723 E |
| 5,804,259 A * | 9/1998 | Robles | 427/577 |
| 5,834,371 A * | 11/1998 | Ameen et al. | 438/656 |
| 5,888,907 A * | 3/1999 | Tomoyasu et al. | 438/714 |
| 5,900,103 A * | 5/1999 | Tomoyasu et al. | 156/345.44 |
| 5,950,675 A * | 9/1999 | Minami et al. | 137/606 |
| 5,958,140 A * | 9/1999 | Arami et al. | 118/725 |
| 5,968,379 A * | 10/1999 | Zhao et al. | 219/121.52 |
| 6,024,044 A * | 2/2000 | Law et al. | 118/723 E |
| 6,024,826 A * | 2/2000 | Collins et al. | 156/345.37 |
| 6,025,013 A * | 2/2000 | Heming et al. | 427/9 |
| 6,042,686 A * | 3/2000 | Dible et al. | 156/345.44 |
| 6,054,013 A * | 4/2000 | Collins et al. | 156/345.27 |
| 6,074,518 A * | 6/2000 | Imafuku et al. | 156/345.46 |
| 6,106,737 A * | 8/2000 | Tomoyasu et al. | 216/67 |
| 6,129,806 A * | 10/2000 | Kaji et al. | 156/345.46 |
| 6,133,148 A * | 10/2000 | Won et al. | 438/680 |
| 6,162,323 A * | 12/2000 | Koshimizu | 156/345.26 |
| 6,171,438 B1 * | 1/2001 | Masuda et al. | 156/345.27 |
| 6,197,151 B1 * | 3/2001 | Kaji et al. | 156/345.46 |
| 6,244,211 B1 * | 6/2001 | Nishikawa et al. | 118/723 AN |
| 6,264,788 B1 * | 7/2001 | Tomoyasu et al. | 156/345.43 |
| 6,287,980 B1 * | 9/2001 | Hanazaki et al. | 438/726 |
| 6,379,756 B2 * | 4/2002 | Komino | 427/569 |
| 6,380,684 B1 * | 4/2002 | Li et al. | 315/111.21 |
| 6,391,147 B2 * | 5/2002 | Imafuku et al. | 156/345.47 |
| 6,423,242 B1 * | 7/2002 | Kojima et al. | 216/79 |
| 6,431,115 B2 * | 8/2002 | Komino et al. | 118/723 VE |
| 6,471,830 B1 * | 10/2002 | Moslehi et al. | 204/192.12 |
| 6,508,913 B2 * | 1/2003 | McMillin et al. | 156/345.29 |
| 6,544,380 B2 * | 4/2003 | Tomoyasu et al. | 156/345.51 |
| 6,553,332 B2 * | 4/2003 | Leng | 702/182 |
| 6,576,860 B2 * | 6/2003 | Koshimizu et al. | 219/121.43 |
| 6,590,344 B2 * | 7/2003 | Tao et al. | 315/111.21 |
| 6,642,149 B2 * | 11/2003 | Suemasa et al. | 438/710 |
| 6,645,302 B2 * | 11/2003 | Udagawa | 118/715 |
| 6,706,138 B2 * | 3/2004 | Barnes et al. | 156/345.1 |
| 6,719,875 B1 * | 4/2004 | Ohmi et al. | 156/345.47 |
| 6,736,931 B2 * | 5/2004 | Collins et al. | 156/345.48 |
| 6,769,629 B2 * | 8/2004 | Hwang et al. | 239/224 |
| 6,790,311 B2 * | 9/2004 | Collins et al. | 156/345.48 |
| 6,815,365 B2 * | 11/2004 | Masuda et al. | 438/710 |
| 6,829,056 B1 * | 12/2004 | Barnes et al. | 356/625 |
| 6,842,658 B2 * | 1/2005 | Izawa et al. | 700/121 |
| 6,857,387 B1 * | 2/2005 | Sun et al. | 118/723 E |
| 6,935,269 B2 * | 8/2005 | Lee et al. | 118/723 I |
| 6,991,701 B2 * | 1/2006 | Takenaka et al. | 156/345.51 |
| 7,094,315 B2 * | 8/2006 | Chen et al. | 156/345.47 |
| 7,144,521 B2 * | 12/2006 | Rusu et al. | 216/67 |
| 7,166,524 B2 * | 1/2007 | Al-Bayati et al. | 438/530 |
| 7,244,474 B2 * | 7/2007 | Hanawa et al. | 427/562 |
| 7,264,688 B1 * | 9/2007 | Paterson et al. | 156/345.34 |
| 7,291,360 B2 * | 11/2007 | Hanawa et al. | 427/248.1 |
| 7,296,532 B2 * | 11/2007 | Cheng et al. | 118/723 MP |
| 7,396,771 B2 * | 7/2008 | Miya et al. | 438/706 |
| 7,399,499 B2 * | 7/2008 | Basceri | 427/248.1 |
| 7,431,859 B2 * | 10/2008 | Bera et al. | 216/67 |
| 7,494,561 B2 * | 2/2009 | Koshiishi et al. | 156/345.47 |
| 7,506,610 B2 * | 3/2009 | Koshiishi et al. | 118/723 E |
| 7,540,971 B2 * | 6/2009 | Bera et al. | 216/67 |
| 7,541,292 B2 * | 6/2009 | Bera et al. | 438/723 |
| 7,662,232 B2 * | 2/2010 | Kobayashi et al. | 118/715 |
| 7,666,479 B2 * | 2/2010 | Strang | 427/569 |
| 7,674,393 B2 * | 3/2010 | Tahara et al. | 216/58 |
| 7,674,394 B2 * | 3/2010 | Paterson et al. | 216/59 |
| 7,708,859 B2 * | 5/2010 | Huang et al. | 156/345.34 |
| 7,713,379 B2 * | 5/2010 | Rogers | 156/345.43 |
| 7,896,967 B2 * | 3/2011 | Hayasaka et al. | 118/715 |
| 8,083,889 B2 * | 12/2011 | Miya et al. | 156/345.25 |
| 8,187,415 B2 * | 5/2012 | Kim et al. | 156/345.44 |
| 8,193,097 B2 * | 6/2012 | Hirano | 438/710 |
| 8,197,599 B2 * | 6/2012 | Yamada et al. | 118/715 |
| 8,231,799 B2 * | 7/2012 | Bera et al. | 216/67 |
| 8,236,380 B2 * | 8/2012 | Mizusawa | 427/248.1 |
| 2002/0025388 A1 * | 2/2002 | Bhardwaj et al. | 427/569 |
| 2002/0103563 A1 * | 8/2002 | Izawa et al. | 700/121 |
| 2003/0127640 A1 * | 7/2003 | Eguchi et al. | 257/4 |
| 2004/0103844 A1 * | 6/2004 | Chou et al. | 118/715 |
| 2005/0145337 A1 * | 7/2005 | Derderian et al. | 156/345.34 |
| 2005/0257743 A1 * | 11/2005 | Koshiishi et al. | 118/723 E |
| 2006/0000803 A1 * | 1/2006 | Koshiishi et al. | 216/67 |
| 2006/0016559 A1 * | 1/2006 | Kobayashi et al. | 156/345.34 |
| 2006/0042754 A1 * | 3/2006 | Yoshida et al. | 156/345.1 |
| 2006/0169671 A1 * | 8/2006 | Miya et al. | 216/67 |
| 2006/0280867 A1 * | 12/2006 | Park et al. | 427/248.1 |
| 2007/0175391 A1 * | 8/2007 | Mizusawa | 118/689 |
| 2007/0181255 A1 * | 8/2007 | Hayasaka et al. | 156/345.33 |
| 2007/0246162 A1 * | 10/2007 | Paterson et al. | 156/345.38 |
| 2007/0247075 A1 * | 10/2007 | Kim et al. | 315/111.21 |
| 2007/0249173 A1 * | 10/2007 | Kim et al. | 438/711 |
| 2007/0251642 A1 * | 11/2007 | Bera et al. | 156/345.26 |
| 2007/0251917 A1 * | 11/2007 | Bera et al. | 216/58 |
| 2007/0251918 A1 * | 11/2007 | Bera et al. | 216/58 |
| 2007/0254483 A1 * | 11/2007 | Bera et al. | 438/689 |
| 2007/0254486 A1 * | 11/2007 | Bera et al. | 438/706 |
| 2008/0124254 A1 * | 5/2008 | Choi | 422/186.29 |
| 2008/0178805 A1 * | 7/2008 | Paterson et al. | 118/723.1 |
| 2008/0179011 A1 * | 7/2008 | Collins et al. | 156/345.44 |
| 2009/0042321 A1 * | 2/2009 | Sasaki et al. | 438/10 |
| 2009/0095423 A1 * | 4/2009 | Miya et al. | 156/345.33 |
| 2009/0117746 A1 * | 5/2009 | Masuda | 438/710 |
| 2009/0194235 A1 * | 8/2009 | Kobayashi et al. | 156/345.28 |
| 2009/0218317 A1 * | 9/2009 | Belen et al. | 216/67 |
| 2009/0269494 A1 * | 10/2009 | Takahashi et al. | 427/255.28 |
| 2011/0214813 A1 * | 9/2011 | Koshiishi et al. | 156/345.33 |

FOREIGN PATENT DOCUMENTS

| | | |
|---|---|---|
| JP | 11-016888 | 1/1999 |
| JP | 2000-156370 | 6/2000 |
| JP | 2000-208483 | 7/2000 |
| JP | 2001-017852 | 1/2001 |
| JP | 2002-064084 | 2/2002 |
| JP | 2002-093784 | 3/2002 |
| JP | 2002110567 A * | 4/2002 |
| JP | 2002-184764 | 6/2002 |
| JP | 2003-206042 | 7/2003 |
| JP | 2004-088111 | 3/2004 |
| JP | 2004-200429 | 7/2004 |
| JP | 2006165399 A * | 6/2006 |
| JP | 4550507 | 7/2010 |
| WO | WO 96/18207 | 6/1996 |

* cited by examiner

PLASMA PROCESSING APPARATUS

The present application is based on and claims priority of Japanese patent application No. 2004-217118 filed on Jul. 26, 2004, the entire contents of which are hereby incorporated by reference. This application is a Continuation application of prior application Ser. No. 10/911,610, filed Aug. 5, 2004 now abandoned, the contents of which are incorporated herein by reference in their entirety.

FIELD OF THE INVENTION

The present invention relates to a plasma processing apparatus used in the fabrication of semiconductors.

DESCRIPTION OF THE RELATED ART

Heretofore, plasma etching utilizing weakly-ionized plasma is adopted widely in the process of fabricating a semiconductor device such as a DRAM or a microprocessor. Now, FIG. 10 is referred to in explaining the mechanism of etching, taking the etching of an SiOC film as an example. A mixed gas containing $CHF_3$, $CF_4$ and $N_2$ is used as the processing gas, for example. Radicals such as CF and $CF_2$ dissociated from $CHF_3$ and $CF_4$ in the plasma are deposited on the SiOC 51 and resist 52, forming a deposition film 53. Then, the ions generated in the plasma are accelerated by bias power to be incident on the object to be processed, by which energy is applied to the interface between the SiOC 51 and the deposition film 53, causing reaction of the SiOC 51 and the deposition film 53 and progressing etching.

The finishing contour formed after etching depends not only on the energy and variation of ions being incident on the object to be processed but also on the thickness and composition of the deposition film. For example, according to conditions where the deposition film becomes excessively thick or conditions where considerable amount of components such as C that inhibit etching are contained in the deposition film, the etching rate is deteriorated or the etching is stopped before it is completed. This is because the ions being incident on the object to be processed cannot easily reach the interface between the deposition film and SiOC. Moreover, if the deposition film deposited on the side walls of the holes or trenches becomes excessively thick, the etching of the side walls of the holes and trenches may be suppressed excessively, causing the processed bottom portion of the holes and trenches to have a narrowed tapered shape. Oppositely, if the deposition film is too thin, the lack of deposition film to be reacted with SiOC deteriorates the etching rate. According to the example illustrated in FIG. 10, the thickness and composition of the deposition film depends mainly on the balance of deposition of radicals such as CF and $CF_2$ radicals dissociated from $CHF_3$ and $CF_4$, the deposition of reaction products generated by the etching and being incident on the object again, the removal of the deposition film by the N radicals dissociated from $N_2$, and the consumption of the deposition film along with the progression of etching.

The mechanism of etching has been described by taking as an example the etching of SiOC film using $CHF_3$, $CF_4$ and $N_2$, but in etching $SiO_2$ or SiOF films, for example, a process gas containing Ar, CF-based gas such as $C_4F_6$ or $C_5F_8$ and $O_2$ is used. In this case, radicals such as CF and $CF_2$ dissociated from $C_4F_6$ or $C_5F_8$ contribute to the generation of the deposition film, and O radicals dissociated from $O_2$ function to remove the deposition film.

Next, the general outline of a plasma processing apparatus is described with reference to the example illustrated in FIG. 11. The present apparatus is a parallel plate plasma etching apparatus, having equipped in a processing chamber 1 a substantially disk-like antenna 3 for electromagnetic radiation and an electrode 4 on which an object 2 to be processed is placed, which are disposed in parallel and facing each other. An electromagnetic radiation power supply 5A for generating plasma is connected to the antenna 3 via a matching network 6A.

Below the antenna 3 is disposed a shower plate 11. Processing gases are supplied from gas cylinders 20, which are adjusted to predetermined flow rates via gas flow controllers 13, and introduced through gas holes provided to the shower plate 11 to the processing chamber 1. Moreover, in order to control the radical distribution within the plasma, it is possible to introduce processing gases having different compositions or flow rates through the inner area and the outer area of the shower plate 11. An RF power supply 5C is connected to the electrode 4 via a matching network 6C, by which the ions being incident on the object 2 is accelerated to etch the object.

There has already been proposed a parallel plate electrode-type RIE apparatus in which a stage electrode and a gas supply electrode are disposed in confronting relationship in the etching chamber to realize uniform etching of a large-diameter wafer, wherein the gas supply surface of the gas supply electrode is divided into three areas, a first gas supply area, a second gas supply area and a third gas supply area, and the gas supply to each gas supply area is controlled independently through a first gas flow rate control system, a second gas flow rate control system and a third gas flow rate control system, respectively. Thereby, the flow rate of etching gas and the flow ratio of gases having different ionization potential to be supplied via the first, second and third gas supply areas are optimized (refer for example to patent document 1).

Moreover, the present applicant has filed a patent application disclosing a plasma etching apparatus comprising a processing chamber for performing plasma etching to an object to be processed, a first gas supply source for supplying processing gas, a second gas supply source disposed independently from the first processing gas, a first gas inlet for introducing the processing gas into the processing chamber, a second gas inlet disposed independently from the first gas inlet, a flow controller for controlling the flow rate of the processing gas, and a gas flow divider for dividing the process gas into plural flows, wherein the second gas is supplied between the gas flow divider and at least one of the first or second gas inlets so as to supply the processing gas via two systems (refer for example to patent document 2).

[Patent document 1]
Japanese Patent Application Laid-Open No. 2002-184764
[Patent document 2]
Japanese Patent Application No. 2003-206042

In order to perform uniform etching across the plane of an object such as a wafer, the in-plane distribution of ions being incident on the surface of the object (plasma distribution) and the thickness and composition of the deposition film being deposited on the object must be uniform across the plane of the object. The conventional plasma processing apparatus mentioned earlier is equipped with a means for controlling the plasma distribution and radical distribution in order to carry out uniform plasma processing across the plane of the object. However, the process dimension regarded important in the fabrication of semiconductor devices include the process depth and the critical dimension (CD), and according to the prior art plasma processing apparatus, the in-plane uniformity of the process depth and the in-plane uniformity of the critical dimension could not be controlled independently.

Here, critical dimension (CD) refers for example to the width of a trench, a width of a line or a diameter of a hole in the micropattern formed on the object being processed. Therefore, the in-plane uniformity of the critical dimension may be deteriorated by enhancing the in-plane uniformity of process depth, so it is necessary to seek the process conditions that fulfill both the in-plane uniformity of process depth and in-plane uniformity of critical dimension through trial and error, by adjusting little by little the flow rate and composition of the process gases supplied through the inner area and outer area of the shower plate, the bias power and the discharge power.

Compared to the process depth, the critical dimension depends greatly on the thickness and composition of the deposition film, so it is preferable that the in-plane distribution of the critical dimension be uniformized without changing the uniformity of process depth by appropriately controlling the thickness and composition of the deposition film. Since the method for controlling the composition and flow rate of gases being introduced through the inner gas holes and the outer gas holes of the shower plate allows a large degree of freedom of radical distribution control, the method is promising as a way for appropriately controlling the thickness and composition of the deposition film.

SUMMARY OF THE INVENTION

In consideration of the above-mentioned problems, the present invention aims at providing a plasma processing apparatus that optimizes the gas supply system thereof to enable the process depth uniformity and the critical dimension uniformity of the object to be controlled independently, or in other words, to enable the critical dimension to be controlled without changing the process depth uniformity.

The present invention provides a plasma processing apparatus comprising a processing chamber, a means for supplying processing gas to the processing chamber, an evacuation means for decompressing the processing chamber, an electrode on which an object to be processed is placed, and an electromagnetic radiation power supply, wherein at least two kinds of processing gases having different flow ratio or $O_2$ or $N_2$ composition ratio are introduced from different gas inlets to thereby uniformize the critical dimension across the plane of the object while maintaining a uniform process depth across the plane of the object.

Furthermore, according to the present invention, process gases other than $O_2$ and $N_2$ are divided into plural flows as first processing gas, and $O_2$ and $N_2$ are added as second gas to the first gas having been divided, so that processing gases having different $O_2$ or $N_2$ composition or different flow rate can be introduced through different gas inlets into the processing chamber. At this time, regardless of the amount of $O_2$ or $N_2$ to be added to the first gas having been divided into plural flows, a gas distributor for dividing the first gas into plural flows is used to divide the first processing gas into predetermined flow ratios.

Moreover, the present invention is equipped with a gas distributor for dividing $O_2$ or $N_2$ into predetermined flow ratios in order to add the $O_2$ or $N_2$ of predetermined flow ratios to the divided first gas.

Further, the present invention characterizes in disposing gas flow meters between the first gas outlet provided in the processing chamber and the gas distributor and between the second gas outlet provided in the processing chamber and the gas distributor, so as to monitor whether the gas distributors are operating normally.

Even further, the present invention characterizes in connecting gas lines for evacuating processing gases without passing through the processing chamber between the first gas outlet provided in the processing chamber and the gas distributor and between the second gas outlet provided in the processing chamber and the gas distributor, so as to check whether the gas distributors are operating normally.

According further to the present invention, an O-ring is used to divide the gas dispersion plate for dispersing processing gases into a first gas dispersion area and a second gas dispersion area, and the dispersion plate is screwed onto the antenna or a top panel so that it will not be lifted by the O-ring and that the O-ring stays in position.

Moreover, the present invention characterizes in that the gas holes provided to the shower plate are arranged substantially concentrically, so that the gas holes of the shower plate do not overlap with the position of the O-ring.

Even further, the present invention characterizes in that the area for dispersing the second gas in the gas dispersion plate is donut-shaped, and in order to uniformly disperse the gas in the donut-shaped area, plural gas outlets for ejecting the second processing gas onto the dispersion plate is arranged substantially circumferentially.

As explained, according to the present invention, at least two kinds of processing gases having different $O_2$ or $N_2$ composition ratios or different flow rates are introduced through different gas inlets at predetermined flow rate and composition into the processing chamber, to thereby uniformize the critical dimension across the plane of the object independently from the in-plane uniformity of the process depth. Thus, the uniformity of both the process depth and the critical dimension across the plane of the object can be improved.

DETAILED DESCRIPTION OF THE PREFERRED EMBODIMENT

Figure 1:
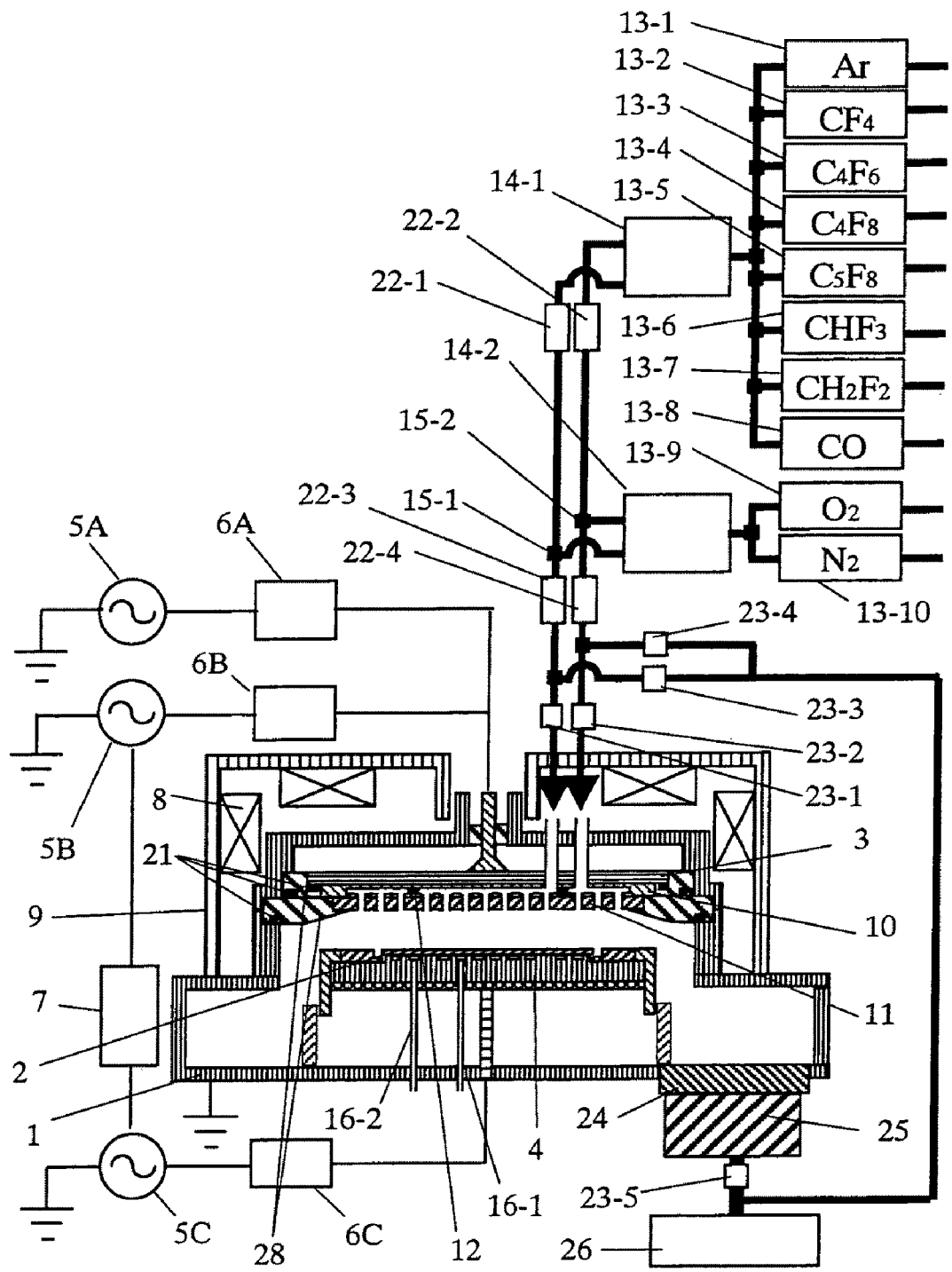
FIG. 1 is a schematic view showing a first embodiment in which the present invention is applied to a parallel plate ECR plasma etching apparatus.

Now, a first preferred embodiment of the present invention will be explained with reference to the drawings. FIG. 1 illustrates the first embodiment in which the present invention is applied to a parallel-plate ECR plasma processing apparatus. A substantially disk-shaped antenna 3 for electromagnetic radiation and an electrode 4 parallel to and in confronting relation with the antenna 3 on which an object 2 to be processed is placed are disposed in a processing chamber 1. An electromagnetic radiation power supply 5A for plasma generation is connected to the antenna 3 via a matching network 6A. The frequency of the electromagnetic radiation power supply 5A is set for example to 100 through 450 MHz. A coil 8 and a yoke 9 are disposed outside the processing chamber 1 for generating a magnetic field. The present apparatus is capable of generating plasma efficiently through the interaction of magnetic field and electric field, and also capable of controlling the plasma generating position or plasma transport by adjusting the magnetic field distribution.

A shower plate 11 is placed below the antenna 3 via a dispersion plate 10. The material of the shower plate 11 is Si. Apart from the electromagnetic radiation power supply 5A, the antenna 3 is connected to an RF power supply 5B via a matching network 6B, through which the plasma distribution and radical distribution of F or the like can be controlled. The frequency of the RF power supply 5B can be set from a few hundred kHz to a little over ten MHz.

According to the present apparatus, the area above the antenna is atmospheric, so an O-ring 21 is disposed to seal the antenna 3 and a quartz member 28.

An RF power supply 5C is connected to the electrode 4 via a matching network 6C so as to control the flux or energy of ions being incident on the object 2 to be processed. The RF power supply has the same frequency as the RF power supply 5B, and the RF power generated by the RF power supply 6C is set to be in opposite phase to that of the RF power supply 6B through use of a phase controller 7, according to which the confinement of plasma is enhanced. The electrode 4 can be moved in the vertical direction, and the plasma distribution and radical distribution can be controlled by adjusting the distance between the antenna 3 and the electrode 4.

A refrigerant is set to flow within the electrode 4 (not shown) To control the temperature of the object 2 to be processed. Moreover, the surface of the electrode 4 is provided with a groove that allows helium to flow through between the back surface of the object 2 and the electrode so as to cool the object. Moreover, the flow path of helium is divided into two parts, the inner area and the outer periphery of the electrode, so as to control the temperature of the object to be processed independently at the inner area and the outer periphery of the object. Helium can be supplied to the inner area and to the outer periphery of the electrode at different flow rates via a helium inlet passage 16-1 for supplying helium to the inner area of the electrode and a helium inlet passage 16-2 for supplying helium to the outer periphery of the electrode.

In order to secure the object 2 to be processed to the electrode 4 via electrostatic chuck, a dipole power supply (not shown) is connected to the electrode 4. The processing chamber is set to earth potential.

Processing gas is fed to the processing chamber 1 through the electromagnetic radiation antenna 3, the gas dispersion plate 10 and the shower plate 11. The shower plate 11 has multiple gas holes provided thereto. The gas holes are arranged substantially concentrically, for example, with 10 mm intervals within a 300 mm diameter area.

The gas dispersion plate 10 is separated by a substantially ring-shaped partition 12 for controlling the radical distribution in the plasma, enabling processing gases having different compositions or different flow rates to be introduced via gas holes of the shower plate 11 positioned in the inner area of the ring-shaped partition 12 (hereinafter called "inner gas holes") and gas holes of the shower plate 11 positioned outside the ring-shaped partition 12 (hereinafter called "outer gas holes"). An O-ring can be used for example as the ring-shaped partition 12, and the inner diameter of the ring-shaped partition is between approximately 50 through 250 mm.

The processing gases introduced to the processing chamber 1 can include, for example, Ar, $CHF_3$, $CH_2F_2$, $CH_4$, $C_4F_6$, $C_4F_8$, $C_5F_8$, CO, $O_2$ and $N_2$. Of the listed processing gases, Ar, $CH_4$, $C_4F_6$, $C_4F_8$, $C_5F_8$, $CHF_3$, $CH_2F_2$ and CO can be supplied via gas flow controllers 13-1 through 13-8 at predetermined flow rates to reach a first gas distributor 14-1. The gases that have reached the first gas distributor 14-1 are called a first gas. The first gas is divided by the first gas distributor into predetermined flow ratios as a first gas to be introduced through the inner gas holes and a first gas to be introduced through the outer gas holes.

$O_2$ and $N_2$ are supplied via gas flow controllers 13-9 and 13-10 at predetermined flow rates to reach a second gas distributor 14-2. The gases that have reached the second gas distributor 14-2 are called a second gas. The second gas is divided by the second gas distributor into predetermined flow ratios, wherein one flow is mixed at a gas junction 15-1 with the first gas to be introduced through the inner gas holes and the other is mixed at a gas junction 15-2 with the first gas to be introduced through the outer gas holes.

A turbo molecular pump 25 is connected via a gate valve 24 to the processing chamber 1 to decompress the processing chamber 1, enabling the chamber 1 to be maintained at predetermined pressure while the processing gas is supplied thereto. A dry pump 26 is connected to the exhaust side of the turbo molecular pump 25.

Next, the procedure for uniformizing the process depth and the critical dimension across the wafer plane will be explained, taking deep hole etching of an SiOC film as an example. $CF_4$ and $CHF_3$ were used as the first gas, and the flow rates of $CF_4$ and $CHF_3$ were each set to 20 ccm at the gas flow controllers 13-2 and 13-6. $N_2$ was used as the second gas, and the flow rate thereof was set to 100 ccm at the gas flow controller 13-10.

Figure 2:
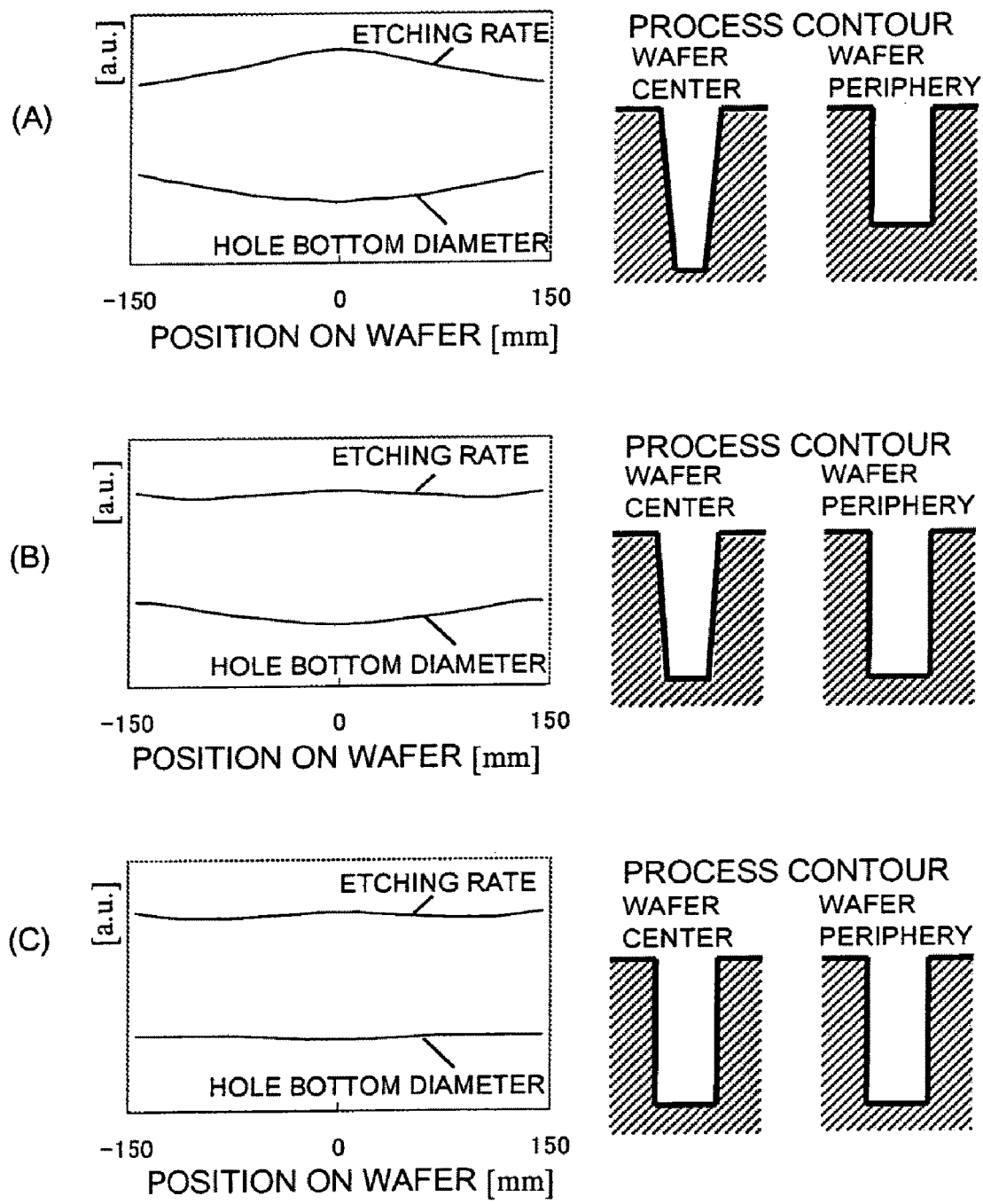
FIG. 2 is an explanatory view showing that the process depth Uniformity and critical dimension uniformity across the object plane can be controlled independently.
Figure 3:
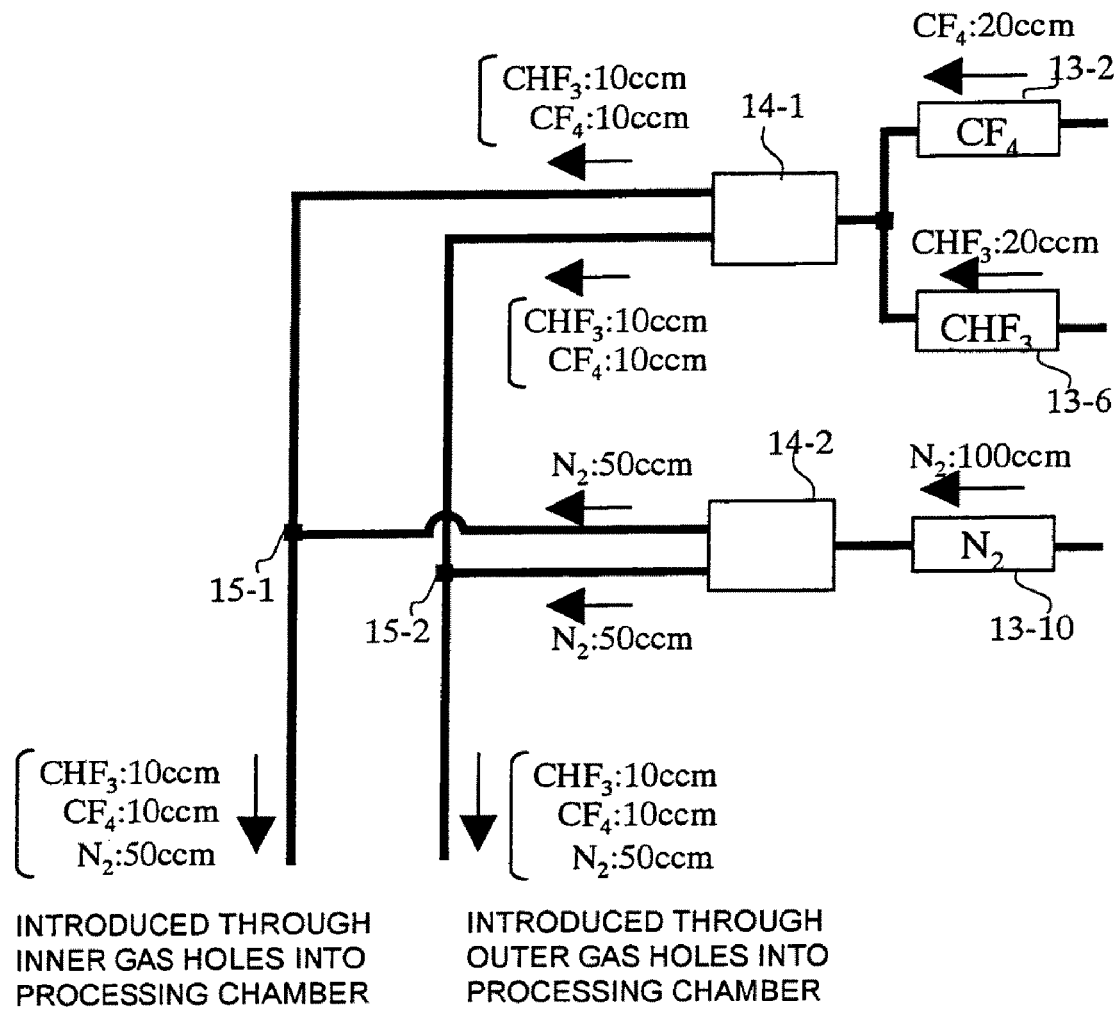
FIG. 3 is an explanatory view showing the gas flow according to the gas supply system when introducing gases having the same composition from the inner and outer gas holes.

At first, the processing gas introduced through the inner gas holes and the processing gas introduced through the outer gas holes are set to have the same composition, and etching was performed without carrying out any plasma distribution control through the magnetic field. The gas flow in the gas supply system is illustrated in FIG. 3. The first gas distributor 14-1 divides 40 ccm of mixed gas containing $CF_4$ and $CHF_3$ equally into 20 ccm, and the second gas distributor 14-2 divides $N_2$ equally into 50 ccm. The wafer in-plane distribution of the process depth and the critical dimension of the hole bottom of this example are illustrated in FIG. 2(A). The etching rate is higher at the center of the wafer and lower at the outer periphery of the wafer, and the holes are deeper at the wafer center where the hole bottom critical dimension is smaller than at the outer periphery of the wafer.

Next, plasma distribution was controlled via the magnetic field to uniformize the process depth across the wafer plane. The wafer in-plane distribution of the process depth and hole bottom critical dimension according to this example is illustrated in FIG. 2(B). As shown, by applying a magnetic field, the in-plane distribution of the etching rate can be uniformized, and thus the in-plane distribution of the process depth can also be uniformized. On the other hand, the hole bottom critical dimension is still small at the wafer center, which is presumed to be caused by the excessive thickness of the deposition film or the large amount of deposition of etching inhibitors at the wafer center.

Figure 4:
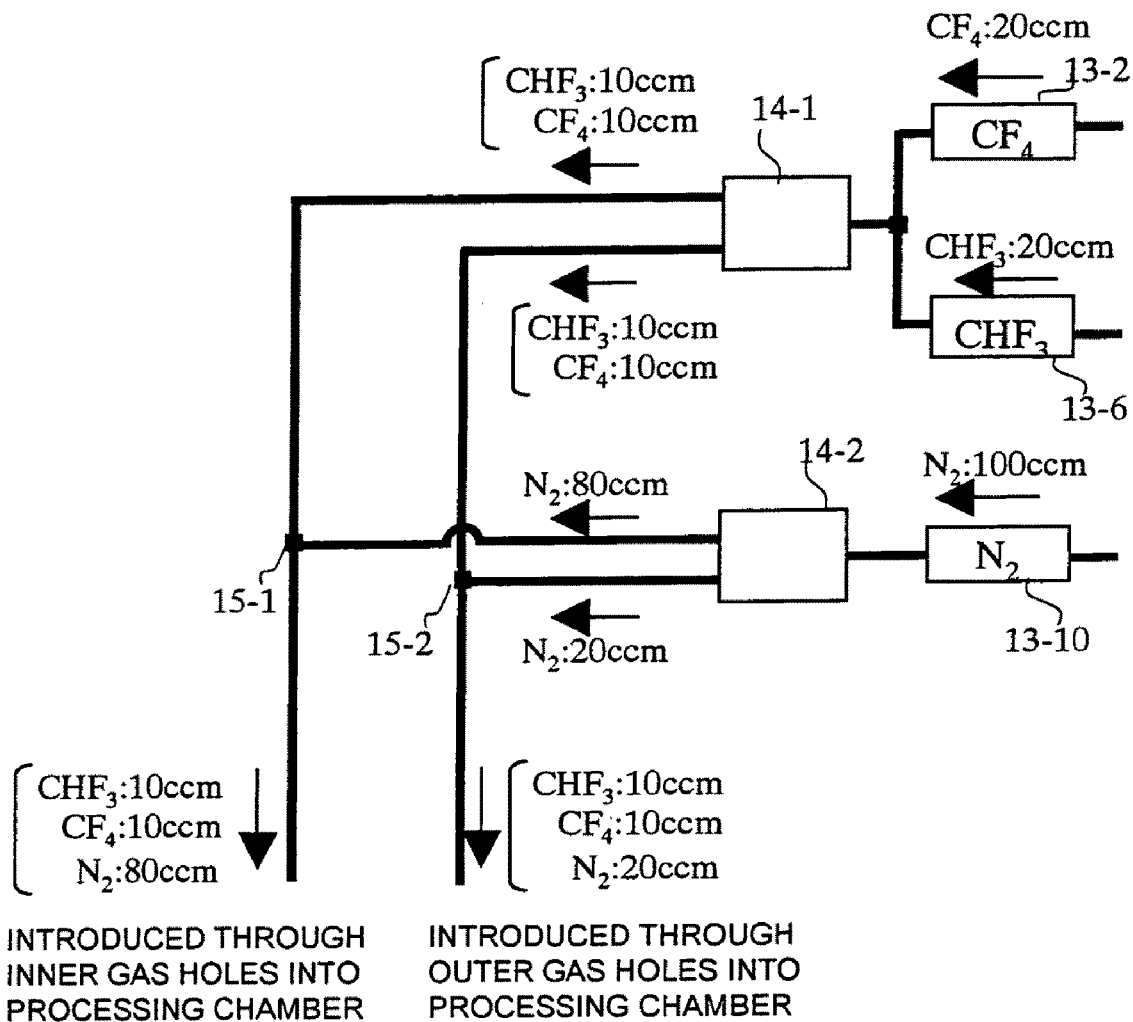
FIG. 4 is an explanatory view showing the gas flow according to the gas supply system when the amount of $N_2$ to be introduced through the inner gas holes is greater than the amount of $N_2$ to be introduced through the outer gas holes.

Next, as shown in FIG. 4, 10 ccm each of $CF_4$ and $CHF_3$ were introduced into the processing chamber uniformly through the inner and outer gas holes, respectively, and $N_2$ which contributes to removal of the deposition film is introduced at flow rates of 80 ccm from the inner gas holes and 20 ccm from the outer gas holes, while performing plasma distribution control through the magnetic field. At this time, the first gas distributor 14-1 divides the mixed gas of 40 ccm composed of $CF_4$ and $CHF_3$ equally into 20 ccm, and the second gas distributor 14-2 divides $N_2$ into flow ratios of 8:2. In other words, the first gas distributor 14-1 and the second gas distributor 14-2 control the ratio of flow of $N_2$ supplied through the inner gas holes and $N_2$ supplied through the outer gas holes into the processing chamber, without changing the flow rate of $CF_4$ and $CHF_3$ supplied through the inner and outer gas holes into the processing chamber. The wafer in-plane distribution of the process depth and the hole bottom critical dimension according to the present example is illustrated in FIG. 2(C). Through comparison with FIG. 2(B), it can be seen that the hole bottom critical dimension can be uniformized across the wafer plane without changing the in-plane uniformity of the process depth.

According to the above explanation, the first gas distributor 14-1 divides the first gas evenly, but it is also possible to adjust the gas distribution ratio of the first gas distributor 14-1 during the state of FIG. 2(B) to control the flow ratio of the first gas supplied through the inner gas holes and through the outer gas holes, in order to further enhance the process depth uniformity. However, the in-plane uniformity of the critical dimension may change by enhancing the process depth uniformity through adjustment of the distribution ratio of the first gas distributor 14-1, so it is preferable to adjust the first gas distribution ratio of the first gas distributor 14-1 before uniformizing the in-plane distribution of the critical dimension.

As described above, it has been shown that in the processing of SiOC, the process depth can be uniformized by the magnetic field and the hole bottom critical dimension can be uniformized by adjusting the flow ratio of $N_2$ introduced through the inner and outer gas holes. In the etching of $SiO_2$ or SiOF, Ar, CF-based gas such as $C_4F_8$, and $O_2$ are used, for example, and in such case, the distribution ratio of $O_2$ can be adjusted through the second gas distributor 14-2 to thereby uniformize the hole bottom critical dimension and other critical dimensions across the wafer plane while maintaining a uniform wafer in-plane process depth.

Now, we will describe the method for confirming the operation of the gas distributors. Gas flowmeters 22-1 and 22-2 are disposed between the first gas distributor 14-1 and processing chamber 1, and gas flowmeters 22-3 and 22-4 are disposed between the second gas distributor 14-2 and processing chamber 1. By comparing the gas distribution ratio set for the first gas distributor 14-1 and the flow ratio of gas flowmeters 22-1 and 22-2 while supplying the first gas, for example, it is possible to check whether the first gas distributor 14-1 is operating normally or not.

Further, by supplying only the second gas and not supplying the first gas, it is possible to check whether the second gas distributor 14-2 is operating normally or not by comparing the gas distribution ratio set for the second gas distributor 14-2 and the flow ratio of gas flowmeters 22-3 and 22-4.

Moreover, valves 23-1 and 23-2 are disposed downstream from the first gas distributor 14-1 and the second gas distributor 14-2 and upstream of the processing chamber 1, and the gas pipes equipped with the valves 23-3 and 23-4 are branched at the upstream side of the valves and downstream side of the gas flowmeters 22-3 and 22-4, to enable the processing gases to be bypassed to the dry pump 26 and evacuated therethrough, for example, without passing through the processing chamber 1, so that the operation of the gas distributors can be checked. The procedure for this operation check will be described hereinafter taking the first gas distributor 14-1 as the example.

First of all, valves 23-1 and 23-4 are opened and valves 23-2 and 23-3 are closed, so that the processing gas to be supplied through the inner gas holes is introduced to the processing chamber 1, and the processing gas to be supplied through the outer gas holes normally is evacuated through the dry pump 26 without passing through the processing chamber 1. Thereafter, the gate valve 24 and valve 23-5 are closed, and 500 ccm of Ar gas is supplied, for example. The gas distribution ratio at the first gas distributor 14-1 is set to a:b, for example. The flow rate of Ar gas introduced through the inner gas holes into the processing chamber 1 can be calculated based on the volume of the processing chamber 1 and the pressure rising speed, and the calculated value is set as A.

Next, valves 23-2 and 23-3 are opened and valves 23-1 and 23-4 are closed, so that the processing gas to be supplied through the inner gas holes normally is evacuated through the dry pump 26 without being introduced to the processing chamber 1 while the processing gas to be supplied through the outer gas holes is introduced into the processing chamber 1. Then, 500 ccm of Ar gas is supplied and the flow ratio of the second gas distributor 14-1 is set as it is to a:b. The flow rate of Ar gas can be calculated based on the capacity of the processing chamber 1 and the pressure rising speed, and the calculated flow rate is set as B. Thereafter, by comparing the ratio of A:B and a:b, it is possible to confirm whether the first gas distributor 14-1 is operating normally or not.

Figure 5:
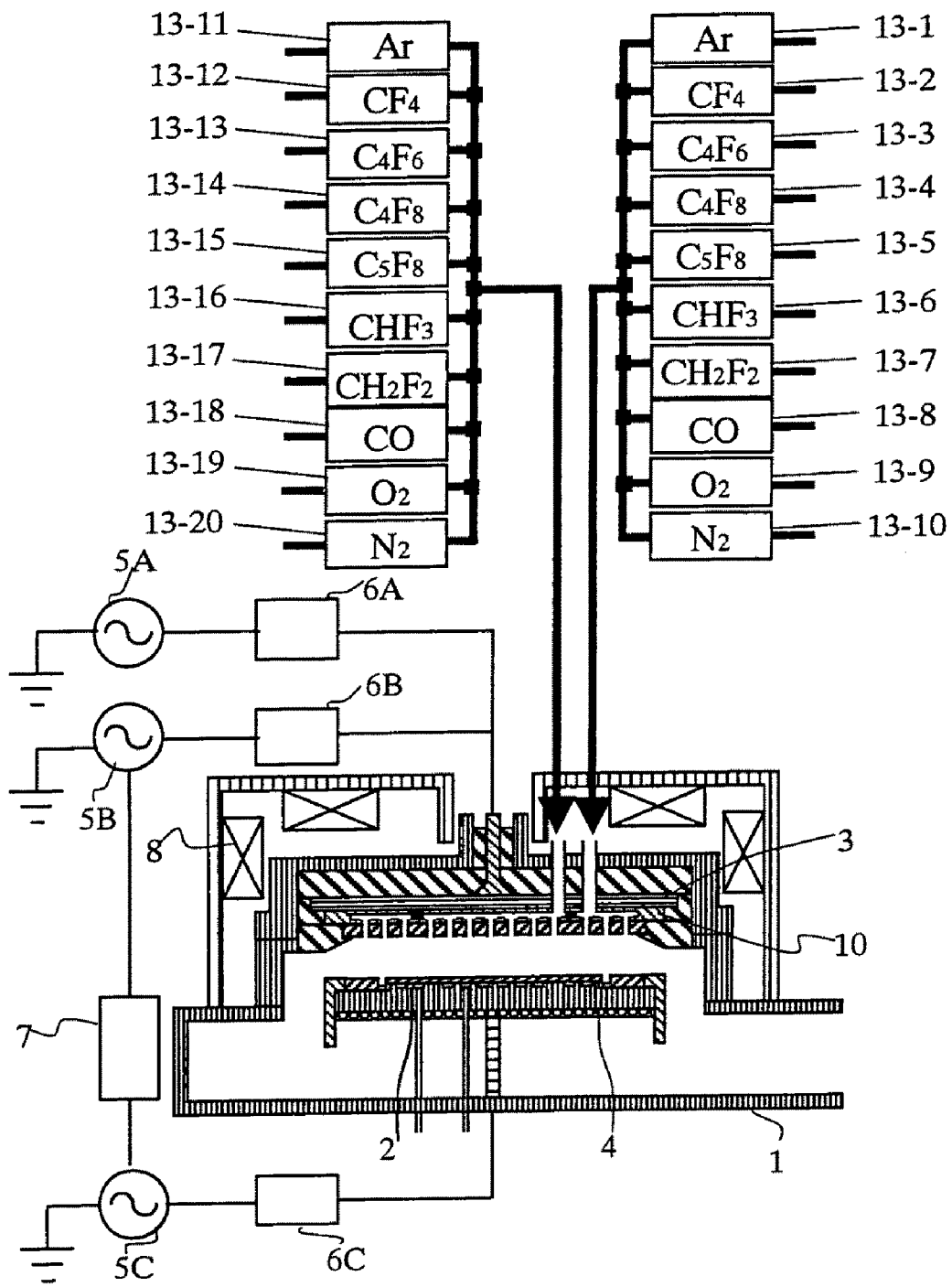
FIG. 5 is a schematic view of a second embodiment in which the present invention is applied to a parallel plate ECR plasma etching apparatus.

The first embodiment has been explained up to now, but the control of gas supply similar to that of the first embodiment can be performed without using gas distributors. Thus, a second embodiment of the present invention will now be explained with reference to FIG. 5. In FIG. 5, the explanations on the portions equivalent to those of FIG. 1 are omitted. The present embodiment comprises gas flow controllers 13-11 through 13-20, one for each processing gas, for controlling the amount of processing gas supplied through the inner gas holes, and gas flow controllers 13-1 through 13-10 for controlling the amount of processing gas supplied through the outer gas holes. As can be seen through comparison with FIG. 1, the necessary number of gas flow controllers 13 is greater compared to the example where the gas distributors 14 are adopted, but the gas supply can be controlled similarly as FIG. 1.

The first and second embodiments described above have illustrated cases in which the present invention was applied to the parallel plate ECR plasma processing apparatus having a large degree of freedom in controlling the plasma distribution via the magnetic field. However, the present invention can be widely applied to plasma processing apparatuses that control the uniformity of plasma distribution through means other than magnetic fields.

Figure 6:
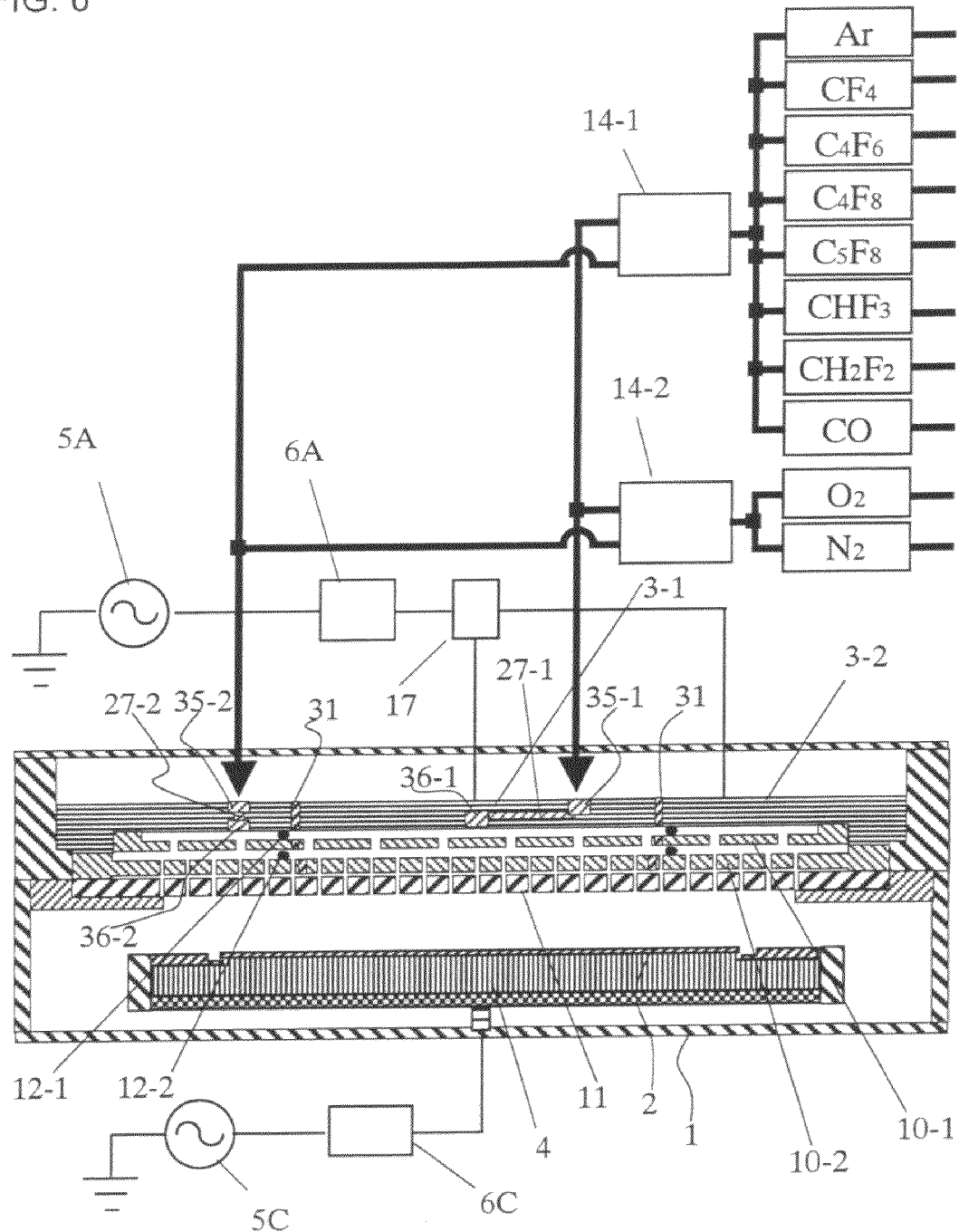
FIG. 6 is an explanatory view of a third embodiment in which The present invention is applied to a CCP plasma processing apparatus.

As an example, a third embodiment of the present invention will now be described. FIG. 6 illustrates an example in which the present invention is applied to a CCP (capacitively coupled plasma) type plasma processing apparatus. The present apparatus radiates electromagnetic waves with a frequency in the range between 10 and 200 MHz from the electromagnetic radiation antenna, and generates plasma by the RF electric field generated between electrodes. The electromagnetic radiation antenna is divided into two parts, for example, an inner antenna 3-1 and an outer antenna 3-2, and by changing the ratio of RF powers radiated from the inner and outer antennas 3-1 and 3-2 via an RF power distributor 17, the freedom of control of plasma distribution is increased. An electrode 4 on which an object 2 to be processed is placed is disposed within a processing chamber 1, and an RF power supply 5C is connected to the electrode 4 via a matching network 6C for controlling the flux and incident energy of ions being incident on the object 2 to be processed. According to the third embodiment shown in FIG. 6, the combination of gas flow controllers and gas distributors 14-1 and 14-2 are the same as that of the first embodiment, but a gas supply system similar to that of the second embodiment can also be adopted.

Figure 7:
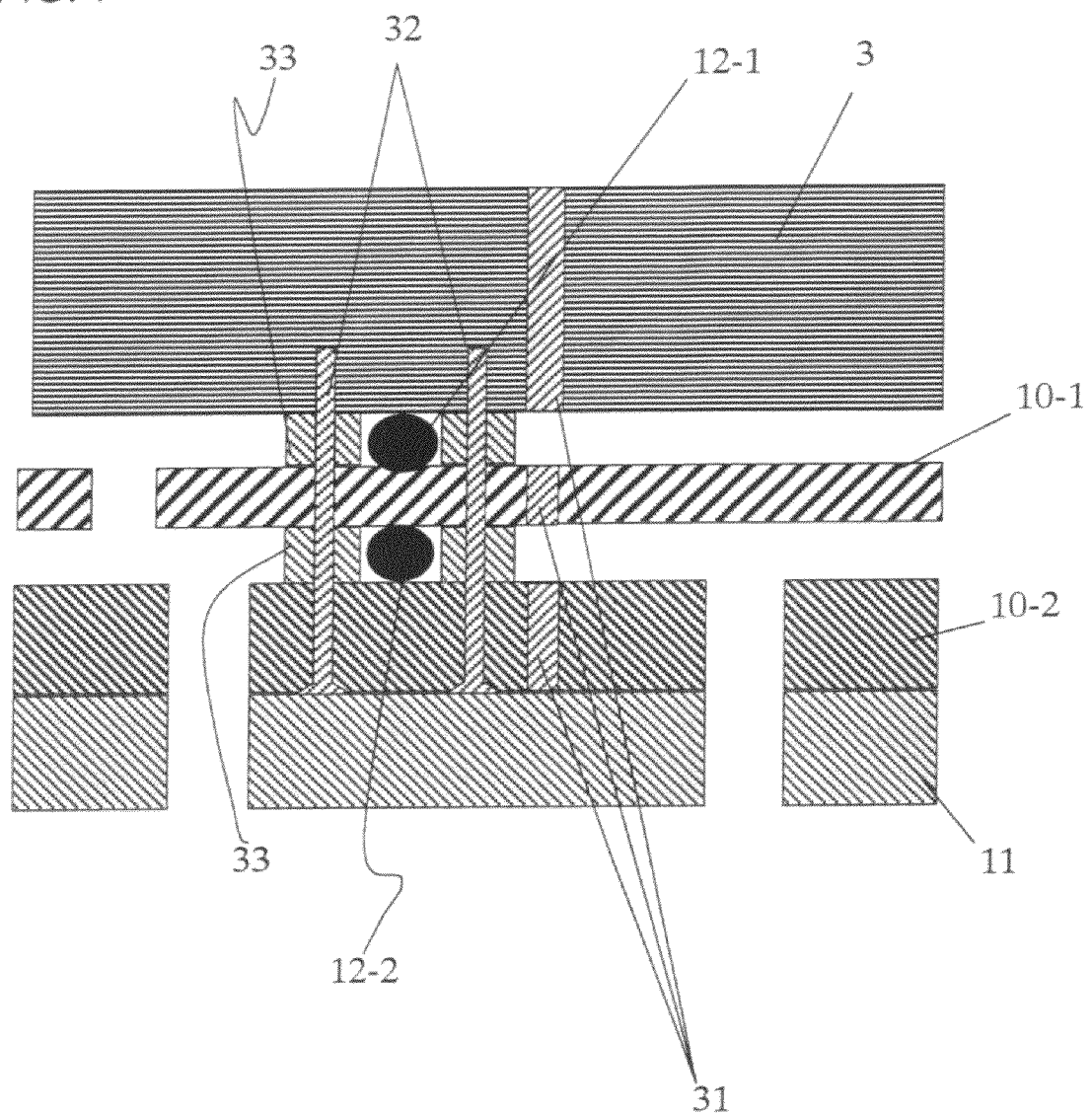
FIG. 7 is a partially enlarged view of FIG. 6.

FIG. 7 is an enlarged view showing the portion where the gas Dispersion plate 10 is divided into two areas, one area for dispersing the processing gas introduced through the inner gas holes into the processing chamber, and the other area for dispersing the processing gas introduced through the outer gas holes into the processing chamber. According to the third embodiment, two gas dispersion plates 10-1 and 10-2, one superposed on the other, are used to disperse the processing gas. The gas dispersion plates 10-1 and 10-2 are divided into two areas, respectively, with ring-shaped partitions (for example, O-rings) 12-1 and 12-2. Moreover, the gas dispersion plates 10-1 and 10-2 are screwed using a screw 32 onto the antenna 3 via an aluminum spacer 33, for example, in order to prevent the gas dispersion plates 10-1 and 10-2 from being bent by the thickness of the O-rings. Furthermore, the gas dispersion plates 10-1 and 10-2 and the antenna 3 are separated via an insulator 31 so as to enable different RF power to be supplied respectively via an inner antenna 3-1 and an outer antenna 3-2.

Figure 8:
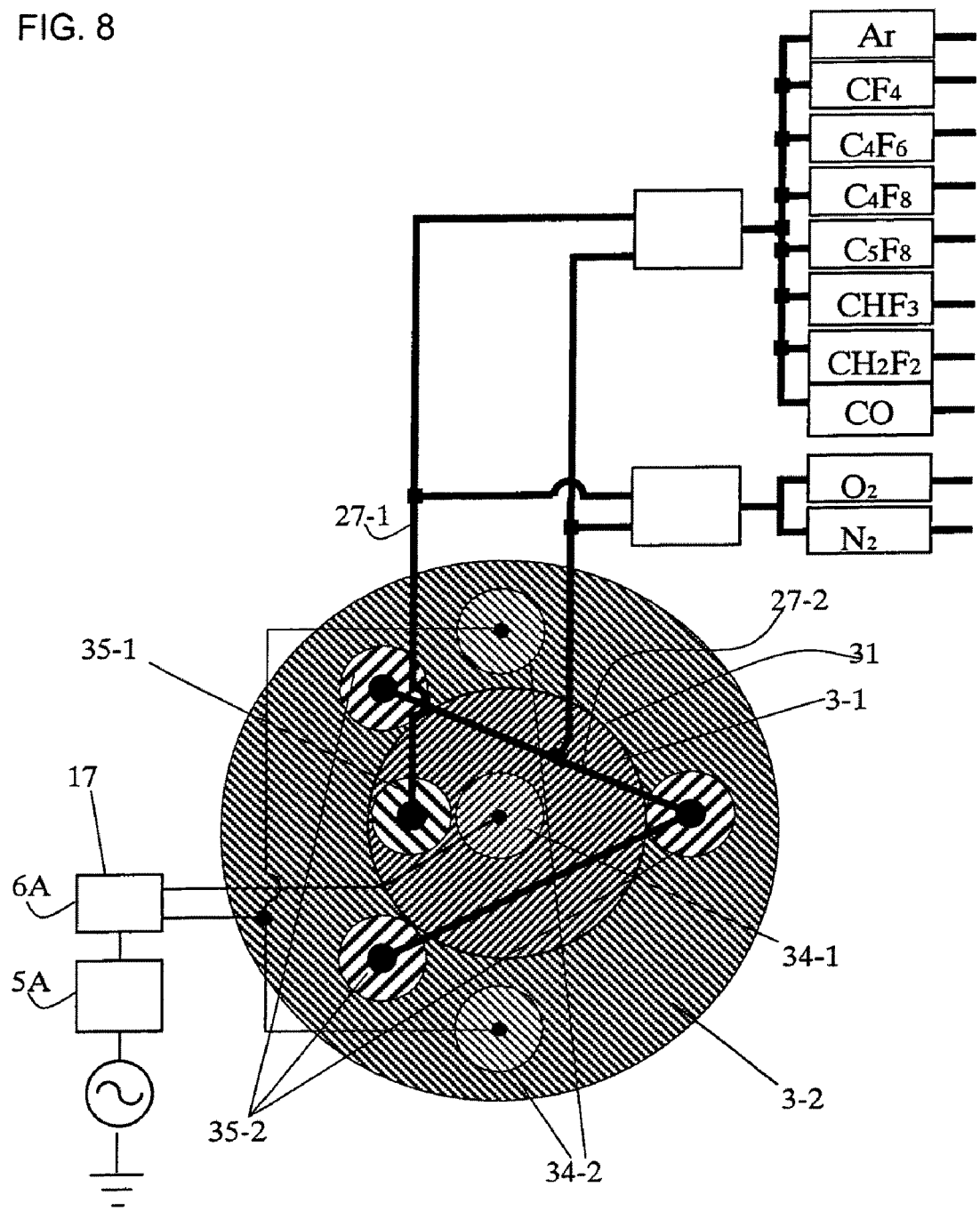
FIG. 8 is an explanatory view showing the structure of the antenna.

The supply of gas and input of RF power to the antenna 3 will be described with reference to FIG. 6 and FIG. 8 illustrating the shape of the antenna 3 seen from the upper direction of the processing chamber. The RF power supplied to the inner antenna 3-1 is fed via a power connect portion 34-1 positioned substantially at the center of the inner antenna 3-1. The RF power supplied to the outer antenna 3-2 is fed via power connect portions 34-2 positioned substantially along the circumference of the outer antenna 3-2.

The processing gas to be introduced through the inner gas holes into the processing chamber is led through the gas inlet 35-1 provided so as not to overlap with the power connect portion 34-1 to the inner side of the inner antenna 3-1, then through the gas flow path 27-1 provided in the antenna and out through the gas outlet 36-1 provided substantially at the center of the antenna onto the upper surface of the gas dispersion plate 10-1. The processing gas to be introduced through the outer gas holes into the processing chamber is led from above the outer antenna 3-2 through the gas inlet 35-2 provided to the antenna and through the gas flow path 27-2 provided in the outer antenna 3-2 to be ejected from the gas outlet 36-2 onto the upper outer surface of the gas dispersion plate 10-1. In order to uniformly supply the processing gas to be introduced through the outer gas holes into the processing chamber through the gas holes provided to the outer side of the shower plate, plural gas inlets 35-2 are arranged substantially concentrically for leading into the antenna the processing gas to be introduced through the outer gas holes into the processing chamber. Further, in order to uniformly disperse the processing gas to be introduced into the processing chamber through the outer gas holes at the outer area of the gas dispersion plate 10-1, plural gas outlets 36-2 are arranged substantially along the circumference of the outer antenna 3-2 for ejecting the processing gas onto the gas dispersion plate.

In order to etch the object to be processed uniformly across the plane thereof according to the present apparatus, at first, the power ratio of RF power radiated via the inner and outer antennas 3-1 and 3-2 are controlled, for example, to uniformize the process depth across the plane of the object. Thereafter, the flow ratio of $O_2$ or $N_2$ gas introduced through the inner and outer gas holes into the processing chamber is controlled so as to uniformize the critical dimension across the plane of the object while maintaining a uniform process depth.

Figure 9:
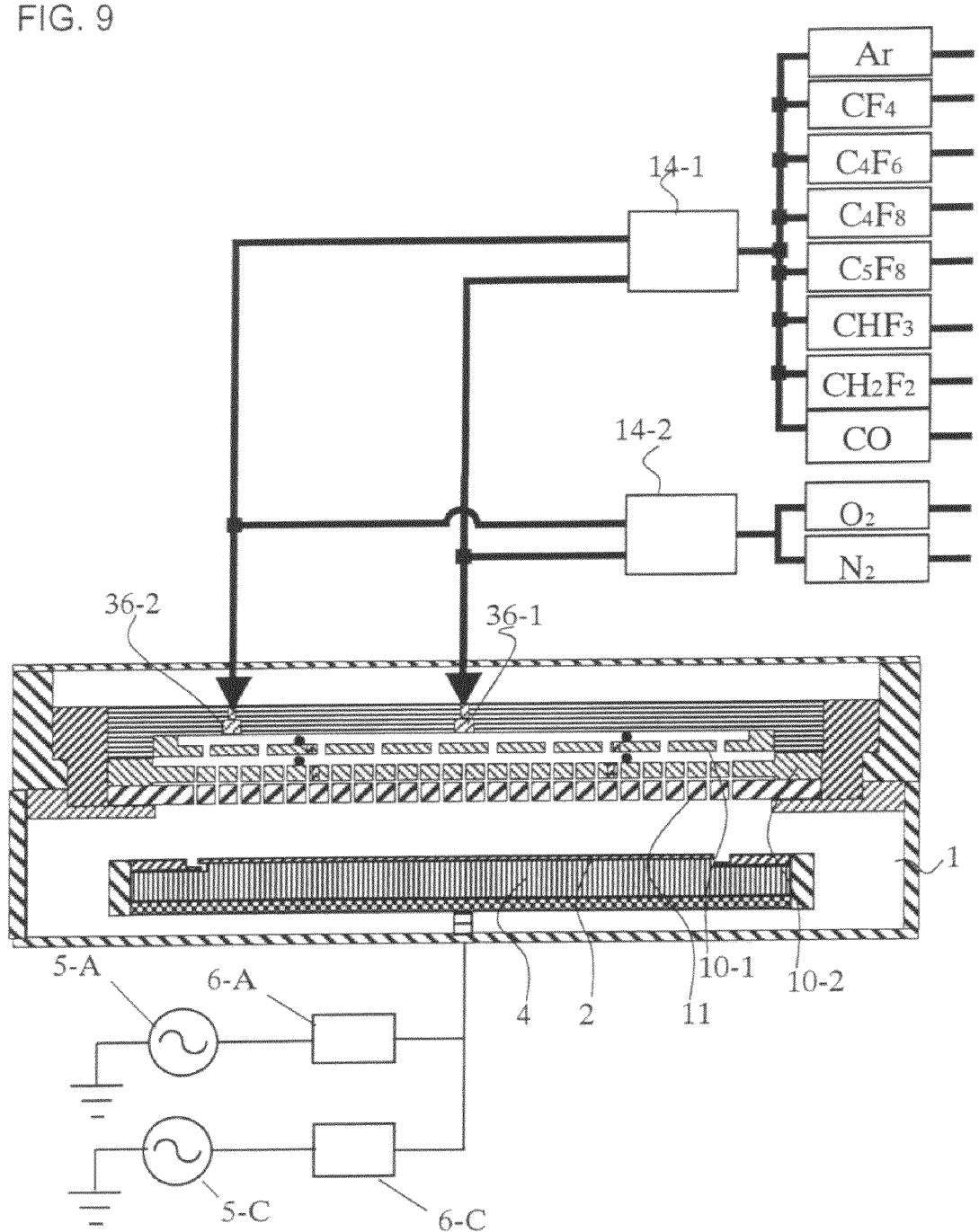
FIG. 9 is an explanatory view of a fourth embodiment in which The present invention is applied to a CCP plasma processing apparatus.
Figure 10:
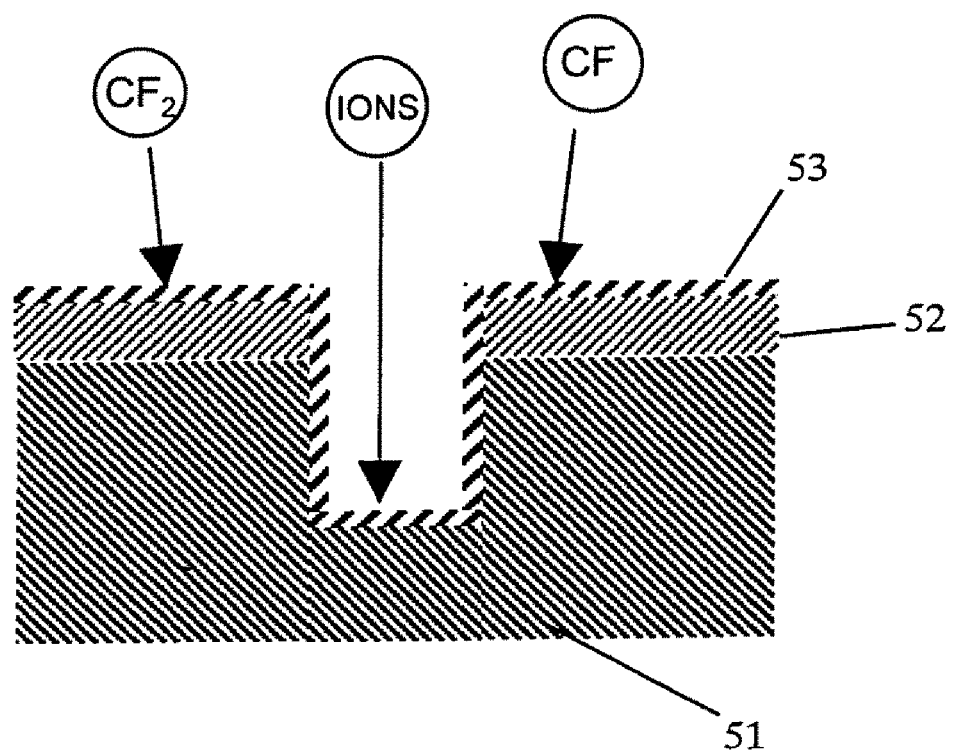
FIG. 10 is an explanatory view showing the mechanism of etching.
Figure 11:
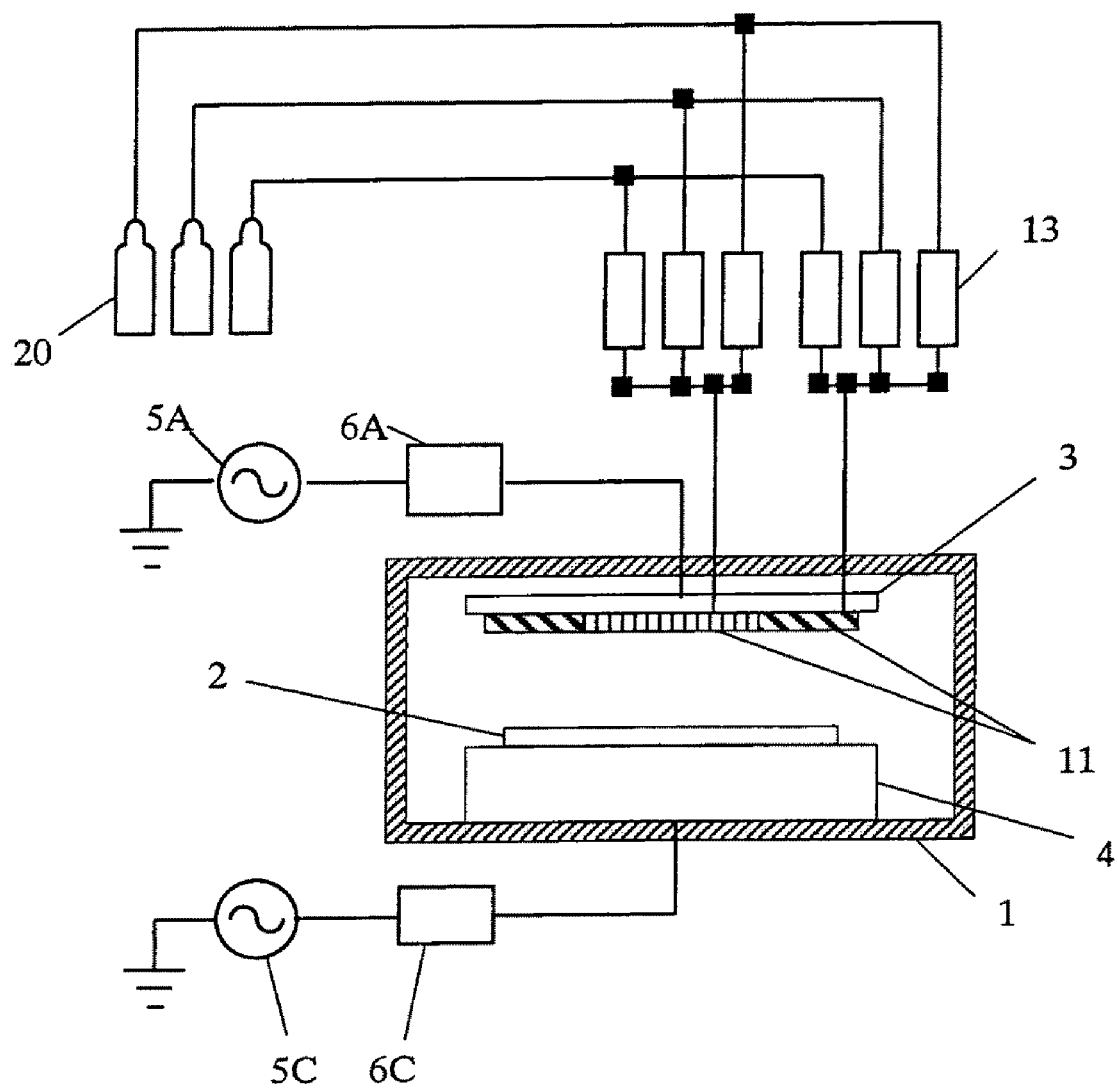
FIG. 11 is an explanatory view showing the parallel plate plasma processing apparatus according to the prior art.

Next, the fourth embodiment of the present invention will be described with reference to FIG. 9. According to the apparatus of the present embodiment, two RF power supplies 5A and 5C with different frequencies are connected to the electrode 4 via matching networks 6A and 6C, respectively. The present apparatus generates plasma through the RF power supplied from the RF power supplies 5A and 5C and controls the distribution of plasma by the balance of power output from the RF power supplies 5A and 5C.

In order to perform uniform etching across the plane of the object according to the present apparatus, for example, the balance between the output power of RF power supply 5A and the output power of RF power supply 5C is adjusted to control the plasma distribution and to uniformize the process depth across the plane of the object. Thereafter, by controlling the flow ratio of $O_2$ or $N_2$ supplied via gas outlets 36-1 and 36-2 of the top plate and through the inner gas holes and the outer gas holes of the shower plate 11 into the processing chamber 1, the critical dimension can be uniformized across the plane of the object while maintaining a uniform process depth across the plane of the object.

The embodiments of the present invention have been described up to now with respect to various plasma sources, but the present invention is not limitedly applied to the described plasma sources, and can be applied widely to other plasma processing apparatuses.

What is claimed is:

1. A plasma processing apparatus comprising:
   a processing chamber,
   an antenna for irradiating electromagnetic waves in the processing chamber,
   a shower plate for feeding processing gas into the processing chamber,
   a gas dispersion plate for dispersing the gas fed to the shower plate,
   a gas supply means for feeding processing gas to the gas dispersion plate,
   an evacuation means for decompressing the processing chamber,
   an electrode on which an object to be processed is placed, and
   an electromagnetic radiation power supply for supplying RF power to the antenna;
   wherein:
   the gas dispersion plate is divided into an inner area and an outer area,
   the gas supply means includes a first gas supply source; a second gas supply source; a first gas flow controller for controlling a flow rate of a gas supplied from the first gas supply source; a second gas flow controller for controlling a flow rate of a gas supplied from the second gas supply source; a first gas distribution means for branching a gas supplied from the first gas flow controller at a predetermined gas flow ratio; a second gas distribution means for branching a gas supplied from the second gas flow controller at a predetermined gas flow ratio; a first junction portion in which one gas branched at the predetermined gas flow ratio via the first gas distribution means and one gas branched at the predetermined gas flow ratio via the second gas distribution means join together; a second junction portion in which the other gas branched at the predetermined gas flow ratio via the first gas distribution means and the other gas branched at the predetermined gas flow ratio via the second gas distribution means join together; a first gas pipe for supplying a gas from the first junction portion to the inner area of the gas dispersion plate; and a second gas pipe for supplying a gas from the second junction portion to the outer area of the gas dispersion plate, and wherein the shower plate has a first gas outlet which supplies a gas supplied from the inner area of the gas dispersion plate into the processing chamber and which is arranged in the inner area of the shower plate, and a second gas outlet which supplies a gas supplied from the outer area of the gas dispersion plate into the processing chamber and which is arranged in the outer area of the shower plate.

2. The plasma processing apparatus according to claim 1, wherein the apparatus further comprises:

a magnetic field generation means for generating a magnetic field in the processing chamber.

3. The plasma processing apparatus according to claim 1, wherein:

the antenna is divided into an inner area and an outer area, and the electromagnetic radiation power supply supplies RF power respectively to the inner area of the antenna and the outer area of the antenna via a distributor.

4. The plasma processing apparatus according to claim 1, wherein the first gas distribution means has a gas distributor.

5. The plasma processing apparatus according to claim 1, wherein the first gas distribution means and the second gas distribution means have a gas distributor.

6. The plasma processing apparatus according to claim 1, further comprising:

an O-ring for separating the gas dispersion plate into plural areas.

* * * * *